(12) United States Patent
Nicolai et al.

(10) Patent No.: US 7,614,247 B2
(45) Date of Patent: Nov. 10, 2009

(54) COOLING ARRANGEMENT

(75) Inventors: Michael Nicolai, Rabenau (DE); Mouhamadou Ousmane, Marburg (DE); Wilfried Braun, Dietzhölztal-Ewersbach (DE); Kurt Schaffer, Eckental (DE)

(73) Assignee: RITTAL RES Electronic Systems GmbH & Co. KG, Herborn (DE)

( * ) Notice: Subject to any disclaimer, the term of this patent is extended or adjusted under 35 U.S.C. 154(b) by 597 days.

(21) Appl. No.: 11/262,318

(22) Filed: Oct. 28, 2005

(65) Prior Publication Data
US 2006/0107678 A1 May 25, 2006

(30) Foreign Application Priority Data
Nov. 9, 2004 (DE) ........................ 10 2004 054 311

(51) Int. Cl.
*F25D 23/12* (2006.01)
*H05K 7/20* (2006.01)
*F28F 7/00* (2006.01)
*H01L 23/34* (2006.01)

(52) U.S. Cl. ........................ 62/259.2; 361/698; 361/699; 165/80.4; 257/714

(58) Field of Classification Search ................ 62/259.2; 361/699, 698, 720, 691, 702; 165/80.4; 257/714
See application file for complete search history.

(56) References Cited

U.S. PATENT DOCUMENTS

| | | | | |
|---|---|---|---|---|
| 6,313,990 | B1 * | 11/2001 | Cheon ........................ | 361/699 |
| 6,807,056 | B2 * | 10/2004 | Kondo et al. ................ | 361/689 |
| 7,428,151 | B2 * | 9/2008 | Sonnabend et al. ......... | 361/699 |
| 2004/0221604 | A1 * | 11/2004 | Ota et al. .................... | 62/259.2 |

FOREIGN PATENT DOCUMENTS

EP      1 448 040 A2      8/2004

* cited by examiner

*Primary Examiner*—Chen-Wen Jiang
(74) *Attorney, Agent, or Firm*—Pauley Peterson Erickson

(57) ABSTRACT

A cooling arrangement with a housing for receiving electronic printed circuit boards or plug-in modules, and with an air-conditioning device which is connected via a coolant-conducting feed line and a return-flow line with at least one electronic component, which is to be cooled, on the respective printed circuit board or plug-in module. The feed line is coupled with at least one component feed line assigned to the electronic component. The return-flow line is coupled with at least one component return-flow line assigned to the electronic component. The component feed line and the component return-flow line have coupling elements attached at ends of the respective printed circuit board or plug-in module which, together with the counter coupling elements of the feed line and the return-flow line attached at the end of the housing, form a coupling connection, which is releasable.

29 Claims, 6 Drawing Sheets

COOLING ARRANGEMENT

BACKGROUND OF THE INVENTION

1. Field of the Invention

This invention relates to a cooling arrangement with a housing for receiving electronic printed circuit boards or plug-in modules, and with an air-conditioning device which is connected via a coolant-conducting feed line and a return-flow line with at least one electronic component, to be cooled, on the respective printed circuit board or plug-in module. The feed line is coupled with at least one component feed line assigned to the electronic component and the return-flow line is coupled with at least one component return-flow line assigned to the electronic component.

2. Discussion of Related Art

A cooling arrangement is known from European Patent Reference EP 1 448 040 A2. Plug-in modules, which are arranged on top of each other in a horizontal plane are housed in a switchgear housing. Built-in electronic devices are located on the plug-in modules, in particular CPUs of computer servers, which must be specifically cooled. Because the generated heat cannot be removed to a sufficient degree by customary air cooling by fans, cooling by coolants is employed. The components to be cooled are cooled by cooling bodies, through which a fluid flows and which are connected with an air-conditioning device through feed and return-flow lines. Component feed and component return-flow hoses are fixedly connected with the individual plug-in modules and are conducted horizontally out of the respective plug-in module. Then the free ends can be connected with vertical feed and return-flow ascending lines leading to the air-conditioning device. When changing individual plug-in modules it is necessary to pull the component feed and component return-flow hoses off and then place them back on the vertical feed and return-flow ascending lines. Also, in connection with the known cooling arrangement it is necessary to provide sufficient space for guiding and handling the hoses coming out of every plug-in module.

SUMMARY OF THE INVENTION

It is one object of this invention to provide a cooling arrangement of the above described type but with an easy and convenient manipulation of printed circuit boards or plug-in modules. Also, the cooling arrangement in accordance with this invention allows a compact structure for the housing, as well as for the printed circuit boards or plug-in modules.

The above and other objects of this invention are accomplished with a cooling arrangement having characteristics described in the claims and this specification.

Accordingly, the component feed line and the component return-flow line have coupling elements attached at ends of the respective printed circuit board or plug-in module. These form, together with the counter coupling elements of the feed line and the return-flow line attached at the end of the housing, a coupling connection, which is releasable. With this arrangement it is possible to directly couple a liquid-cooled printed circuit board or plug-in module to the feed line and to the return-flow line which are connected with the air-conditioning device. Thus, the electronic components to be cooled can be easily connected with a liquid cooling body through which liquid flows and which has a connector for the component feed line and a connector for the component return-flow line.

Advantageously, it is possible to arrange the coupling element of the component feed line and the coupling element of the return-flow line side-by-side in a plug housing. A coupling block is formed, which assures a definite spatial arrangement of the two coupling elements.

The counter coupling element of the feed line and the counter coupling element of the return-flow line can also be arranged side-by-side in a plug housing. A counter coupling block is thus formed which corresponds in a particularly advantageous manner to the coupling head of the component feed line and the component return-flow line.

In one embodiment, a plurality of components, which are to be cooled and which have liquid cooling bodies, can be arranged on a printed circuit board or a plug-in module. It is possible, in a simple and effective manner, to connect the liquid bodies in series on the printed circuit board or the plug-in module. In this case the component feed line and the component return-flow line connect the liquid bodies with each other and with the coupling element of the component feed line and the coupling element of the component return-flow line.

Advantageously, the coupling connection can be designed as a no-drip releasable and pluggable coupling, thus preventing cooling liquid from running out when pulling out the printed circuit board or plug-in module.

In another embodiment, it is possible to house a plurality of electronic printed circuit boards or plug-in modules vertically and extending parallel with each other in the housing. With this arrangement it is possible to conduct the feed line and the return-flow line horizontally at least in part in the housing.

In another embodiment, it is possible to arrange a plurality of housings on top of each other in a switchgear cabinet and let the feed line and the return-flow line extend vertically at least in part in the switchgear cabinet. In this case the air-conditioning device can be arranged in the switchgear cabinet, so that the feed line and the return-flow line supplies every housing. It is possible to provide a separate feed line and return-flow line for each housing. However, one feed line and one return-flow line is used for supplying several housings.

The housing can have a receiving device for inserting the respective electronic printed circuit board or plug-in module in the direction toward the rear wall of the device. It can be advantageous for handling if the rear device wall has the counter coupling elements of the feed line and the return-flow line, to which the coupling elements of the component feed line and the component return-flow line are connected.

For fixing the respective electronic printed circuit board or plug-in module in place, in its inserted state in the housing, it is possible to provide a screw connection.

Besides the liquid-conducting coupling connections, the rear device wall can also have a plurality of electric plug connectors, which are engaged by counter plug connectors attached to the printed circuit board or the plug-in module.

In one embodiment, a rear transition module at the rear of the housing can be assigned to the respective printed circuit board or plug-in module, which has plug connectors for electrical input and output signals. Corresponding electrical counter plug connectors at the printed circuit board or the plug-in module engage the rear transition module. The coupling elements of the component feed line or the component return-flow line in the area of or near the electrical counter plug connectors are arranged at the printed circuit board or the plug-in module, and the counter coupling elements of the feed line or the return-flow line are arranged on the rear transition module. It is thus possible with this arrangement to create a plurality of different connecting options within a narrow space.

In addition or alternatively, the rear device wall can have a back plate with plug connectors for data lines and/or plug connectors for the voltage supply, which are engaged by corresponding counter plug connectors at the respective printed circuit board or plug-in module.

The housing can have a vertically extending strut at the rear for fastening the back plate. The counter coupling elements of the feed and the return-flow lines can be arranged on the strut, wherein the feed and the return-flow lines extend at least in part along the strut.

A space-saving placement of the lines is accomplished if the feed line and the return-flow line are integrated into the strut.

In addition, guide pins for the dependable plugging of the printed circuit board or the plug-in module to the electrical plug connectors and the liquid-conducting coupling connections can be arranged between the components.

For removing the residual heat not removed by the liquid cooling arrangement, it is possible to arrange a fan at the housing or the respective printed circuit board or plug-in module for creating a cooling air flow.

BRIEF DESCRIPTION OF THE DRAWINGS

This invention is explained in greater detail in view of exemplary embodiments represented in the drawings, wherein.

DESCRIPTION OF THE PREFERRED EMBODIMENTS

Figure 1:
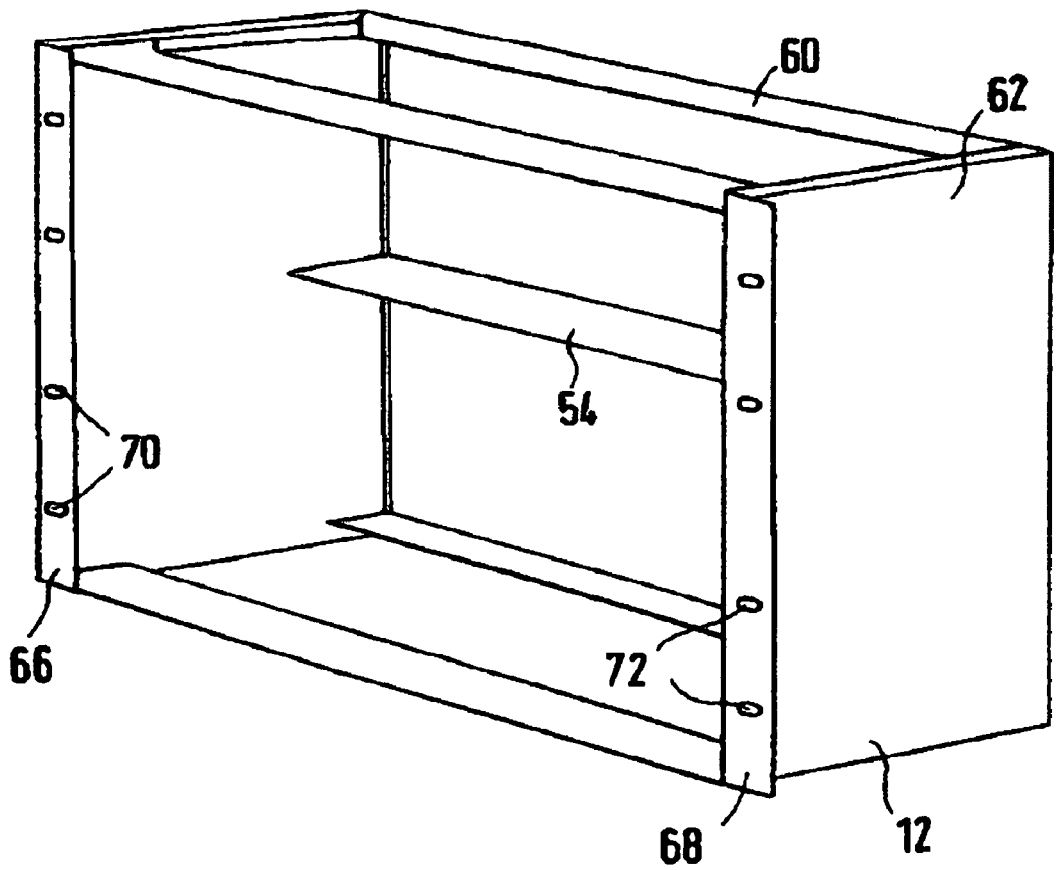
FIG. 1 shows a component support for receiving vertically arranged plug-in modules in a schematic perspective plan view.

In a schematic-perspective plan view, FIG. 1 shows a component support 12 for receiving vertically arranged plug-in modules (not represented). The component support 12 has a support frame 60 with vertical and horizontal profiled frame sections. The two lateral elements of the component support 12 shown in FIG. 1 have lateral walls 64. A bottom plate and a cover plate have not been installed. However, such plates can be attached in a perforated or non-perforated arrangement. A rear wall has also been left out or not installed. However, the component support 12 shows a transverse strut 54, embodied as a T-strut, in the area of its rear wall. The component support 12 is open at the front. There, plug-in modules can be inserted into guide rails (not represented) and, in the inserted state, can be fixed in place on the component support 12 with screw connections. On the left and right sides, the edge area of the front has a laterally protruding frame element 66 and 68, in which several through-bores 70 and 72 for mounting on a switchgear cabinet (not represented) are cut.

Figure 2:
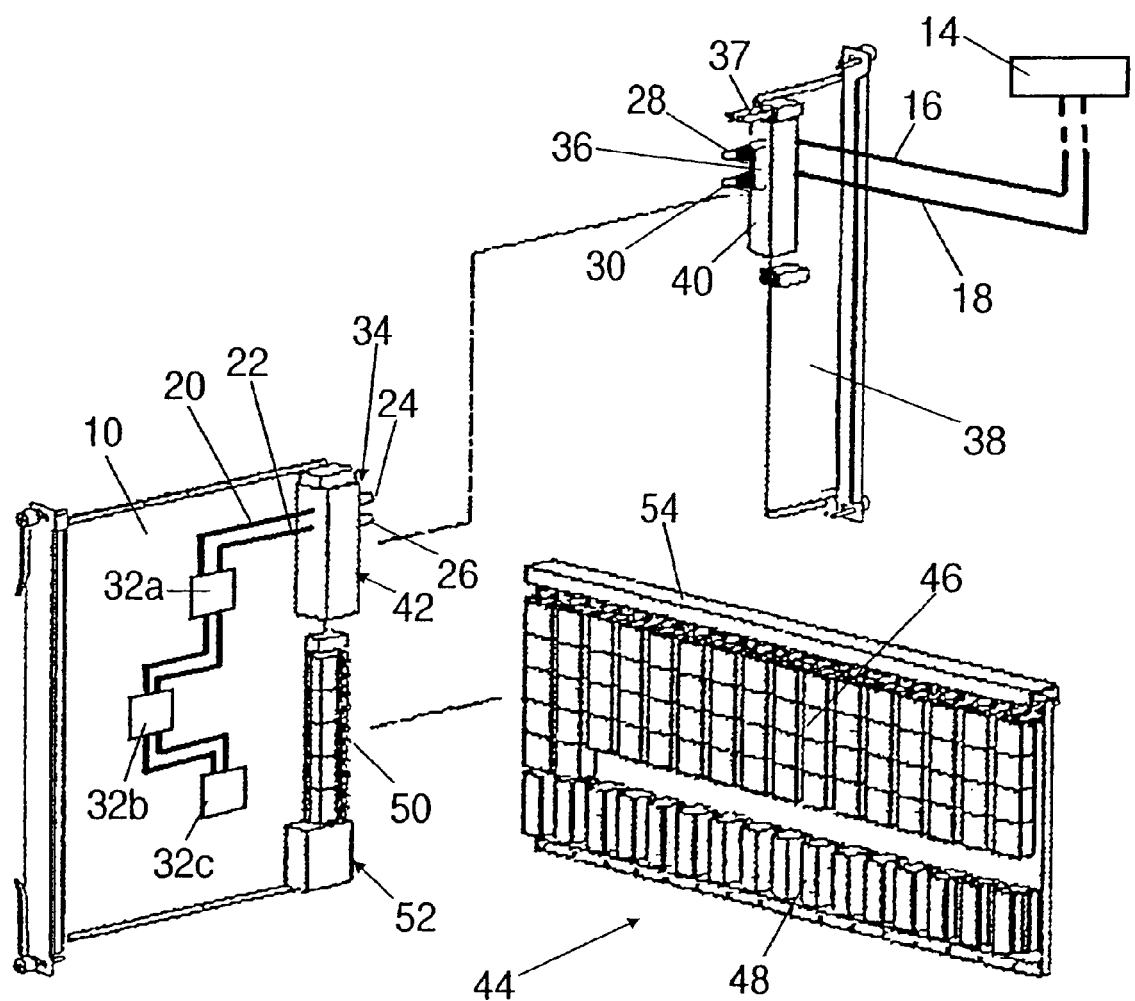
FIG. 2 shows a separated arrangement of a component support, a rear transition module and a rear wall plate in accordance with one embodiment of the cooling arrangement of this invention, in a schematic perspective plan view.

In a schematic-perspective plan view, FIG. 2 shows a component support 10, a rear transition module 36 and a rear wall plate 44 in accordance with a first embodiment of the cooling arrangement in accordance with this invention, in a separate arrangement. The components shown can be installed in a component support 12 in accordance with FIG. 1.

Figure 3:
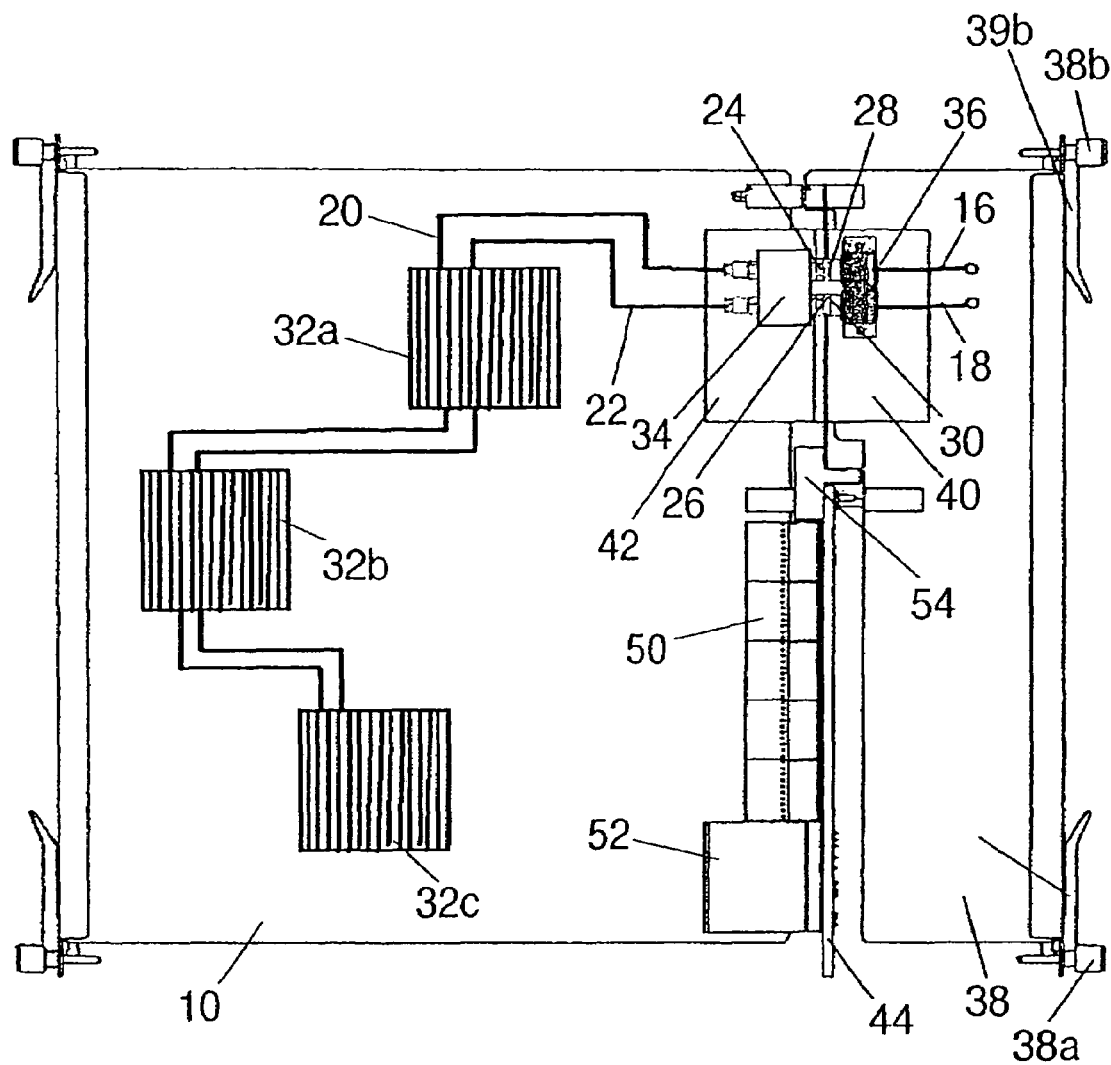
FIG. 3 shows the component support, the rear transition module and the rear wall plate in accordance with FIG. 2, in an assembled arrangement, in a schematic lateral view.

FIG. 3 shows the component support 12, the rear transition module 38 and the rear wall plate 44 in accordance with FIG. 2, in an assembled state.

A schematically represented air-conditioning device 14 is connected via a coolant-conducting feed line 16 and a return-flow line 18 with three liquid cooling bodies 32a, 32b and 32c, through which liquid flows for cooling electronic components (not represented) on the plug-in module 10. The electronic components to be cooled are connected with the liquid cooling bodies 32a, 32b and 32c, through which liquid flows, via a connector for the component feed line 20 and a connector for the component return-flow line 22. The liquid cooling bodies 32a, 32b and 32c are connected with each other in series by the component feed line 20 and the component return-flow line 22, wherein the component feed line 20 and the component flow-return line 22 have coupling elements 24 and 26 attached with their ends to the plug-in module 10. The coupling elements 24 and 26 are arranged in an upper edge area of the plug-in module 10 in a coupling area 10.2, which is kept free of other electronic components. Together with counter coupling elements 28 and 30 of the feed line 16 and the return-flow line 18 attached by their ends to the rear transition module 38, the coupling elements 24 and 26 form a releasable coupling connection. The rear transition module 38 is arranged at the rear wall of the component support 12 in accordance with FIG. 1 and forms a part of its rear wall.

FIG. 3 shows that the coupling element 24 of the component feed line 20 and the coupling element 26 of the component return-flow line 22 are housed side-by-side in a plug housing and form a coupling block 34. The counter coupling element 28 of the feed line 16 and the counter coupling element 30 of the return-flow line 18 are housed side-by-side in a plug housing and form a counter coupling block 36. The coupling connection formed by bringing both coupling blocks 34 and 36 together is designed as a no-drip releasable and pluggable coupling.

FIG. 2 shows that the feed line 16 and the return-flow line 18 extend horizontally at least in sections in the housing 12 or along the rear inside wall. This makes it possible to house a plurality of identical liquid-cooled plug-in modules 10 vertically and extending parallel with respect to each other in the housing 12, and each can be coupled by a liquid-conducting coupling connection with the horizontally extending feed line 16 and the horizontally extending return-flow line 18. It is thus possible to arrange rear transition modules 38, which are aligned parallel with respect to each other, along the horizontally extending feed and return-flow lines 16 and 18, each of which can, by coupling blocks 36 attached to them, connect coupling blocks 34 of inserted plug-in modules 10.

The horizontally extending feed line 16 and the horizontally extending return-flow line 18 each transitions into an ascending line leading vertically to the air-conditioning device 14.

If a plurality of component supports in accordance with FIG. 1 are arranged one on top of the other in a switchgear cabinet (not represented), the feed line 16 and the return-flow line 18 are formed of ascending lines extending at least partially vertically inside the switchgear cabinet. With such an arrangement the ascending lines lead to the air-conditioning device 14 arranged in the upper area of the switchgear cabinet.

In accordance with another embodiment (not represented), a fan or a fan system for generating a cooling air flow can be arranged at the switchgear cabinet, the component support 12 or the respective plug-in modules 10.

In the embodiment shown in FIGS. 2 and 3, a portion of the rear device wall is formed by the rear transition module 38 at the rear of the housing. This module has a plurality of electrical plug connectors, which engage counter plug connectors attached to the plug-in module 10. The rear transition module 38 is attached to the component support 12 by screw connections 38a and 38b at the rear. Manipulation during the insertion into the correct position is simplified by lockable insertion/removal handles 39a and 39b arranged at the lower and upper partial area of the rear transition module.

The plug-in modules 10 can also be inserted and pulled out at the front of the component support 12 with the aid of lockable insertion/removal handles. In the inserted position, the plug-in modules 10 can be fixed in place in the component support 12 by screw connections.

In its upper area facing the plug-in module 10, the rear transition module 38 at the rear of the housing has plug connectors 40 for electrical input and output signals. Corresponding counter plug connectors 42 at the plug-in module 10 engage the plug connectors 40. The coupling elements 24 and 26 of the component feed line 20 or component return-flow line 22 are arranged on the plug-in module 10 in the area of or near the electrical counter plug connectors 42. The counter coupling elements 28 and 30 of the feed line 16 or the return-flow line 18 are arranged on the rear transition module 38.

Guide pins 37, oriented in the direction toward the inserted plug-in module 10, for the assured plugging together of the plug-in module 10 with the electrical plug connectors 42, 50 and 52, and the liquid-conducting coupling connectors 24 and 26 are arranged at the upper partial area of the rear transition module 38.

Figure 4:
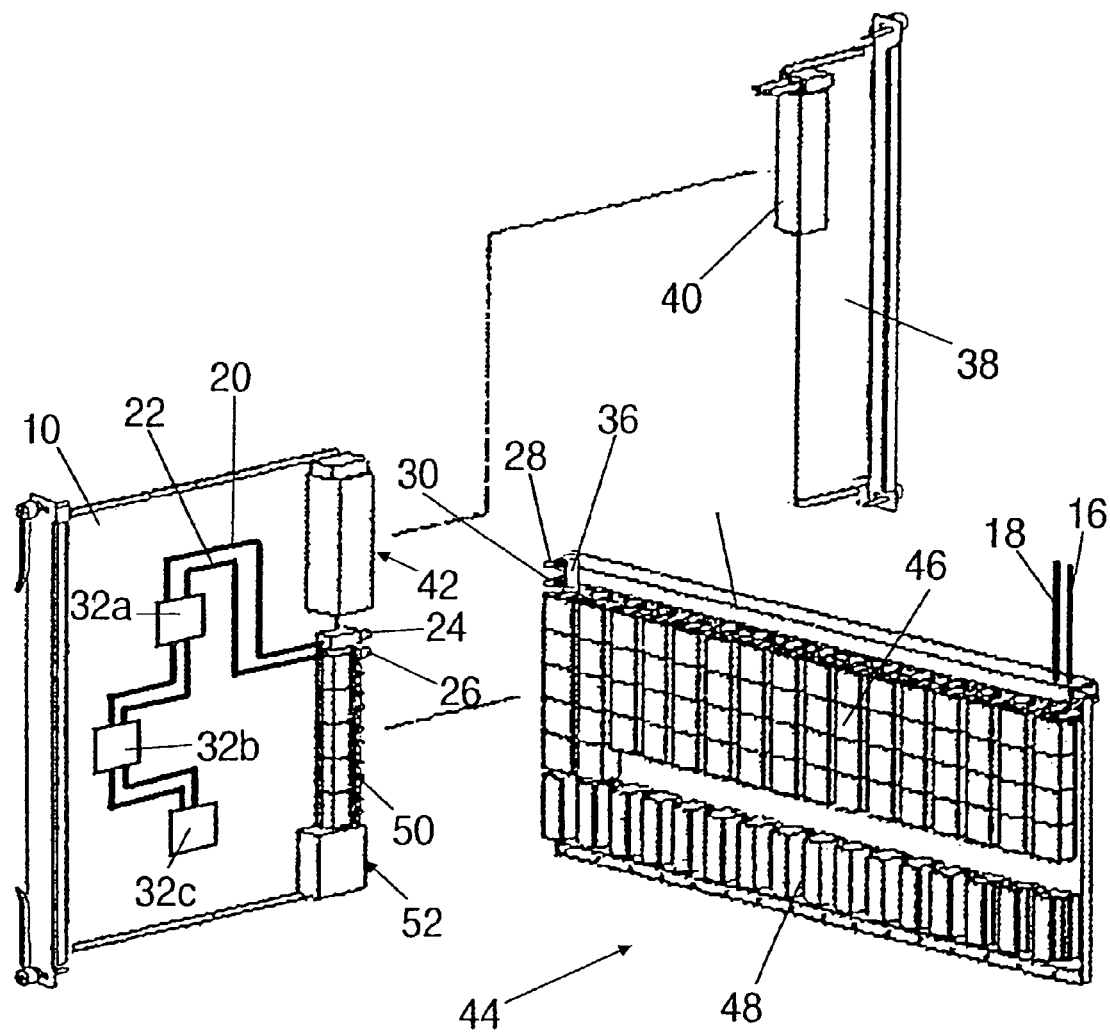
FIG. 4 shows a separated arrangement of a component support, a rear transition module and a rear wall plate in accordance with a second embodiment of the cooling arrangement of this invention, in a schematic perspective plan view.
Figure 5:
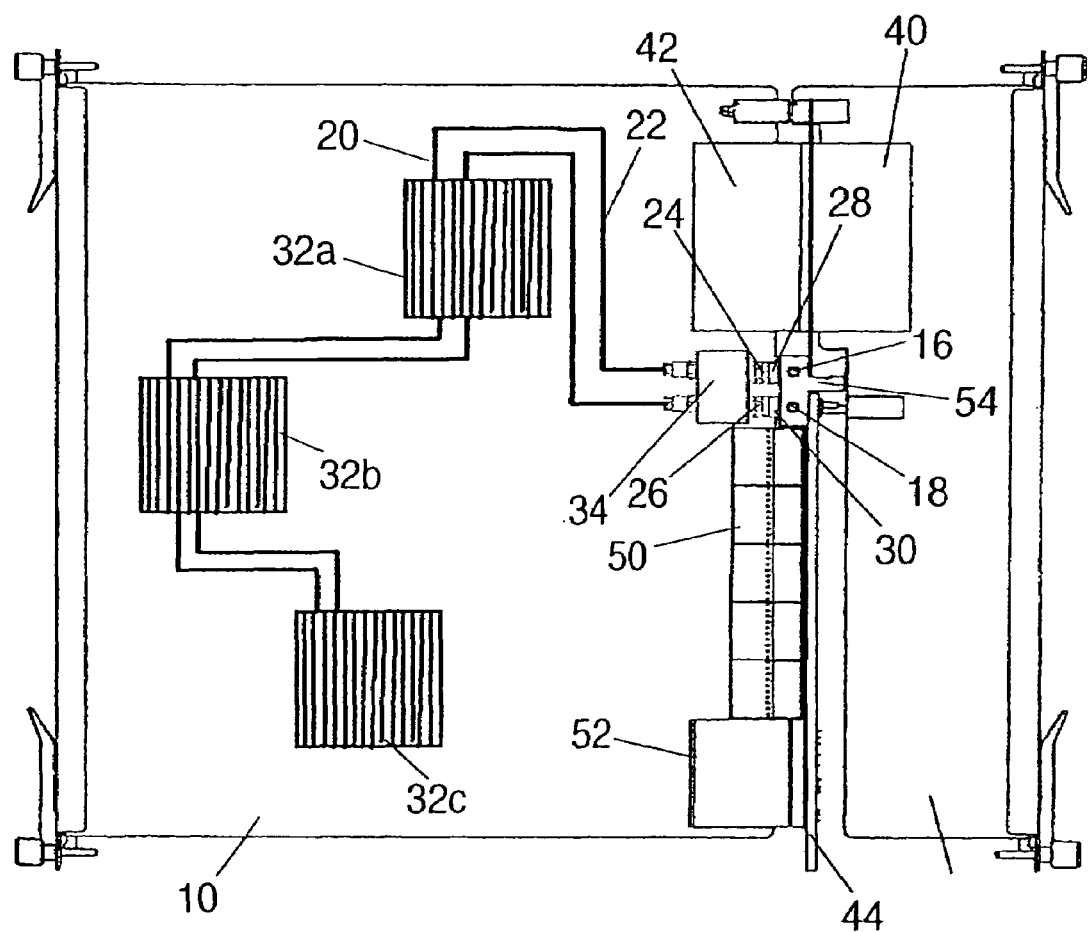
FIG. 5 shows the component support, the rear transition module and the rear wall plate in accordance with FIG. 4, in an assembled arrangement in a schematic lateral view.
Figure 6:
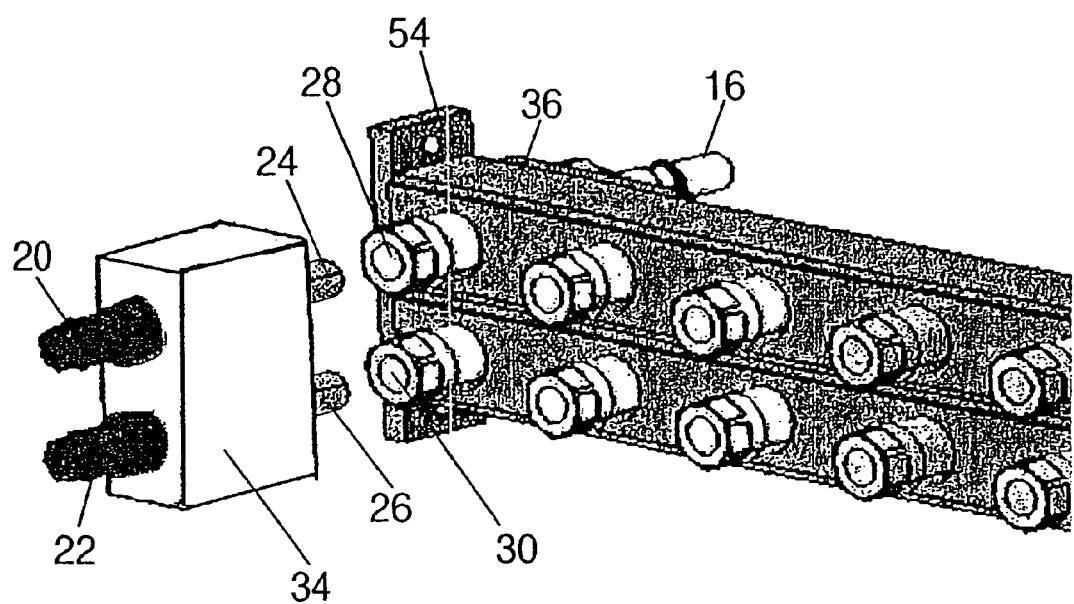
FIG. 6 shows a coupling connection in accordance with the second embodiment represented in FIGS. 5 and 6, in a schematic perspective plan view.

In a schematic-perspective plan view, FIG. 4 shows a component support 10, a rear transition module 38 and a rear wall plate 44 in accordance with another embodiment of the cooling arrangement in accordance with this invention in a separated arrangement, while FIG. 5 shows an assembled arrangement. FIG. 6 shows in a schematic-perspective plan view a coupling connection in accordance with the embodiment shown in FIGS. 4 and 5.

The lower portion of the rear device wall, partially formed by the rear transition module 38, has a rear wall plate 44 supported at the upper edge of the strut 54, which is T-shaped in cross section. The rear wall plate 44 has plug connectors 46 for data lines and/or plug connectors 48 for voltage supply. Corresponding counter plug connectors 50 and 52 at the respective printed circuit board 12 or plug-in module engage the plug connectors 46. The counter coupling elements 28 and 30 of the feed line 16 and the return flow line 18 are arranged on the strut 54. The feed line 16 and the return flow line 18 extend in an interior of the vertically extending strut 54.

It becomes clear from FIG. 6 that a plurality of counter coupling elements 28 and 30 can be arranged parallel along the strut 54 in order to allow connections with a corresponding plurality of plug-in modules 10 inserted parallel relative to each other. The strut 54 simultaneously forms a common coupling block 36 for a plurality of coupling connections.

Instead of a printed circuit board 10 or plug-in connector which can be cooled by a coolant, it is possible to install a printed circuit board in the housing which is conventionally air-cooled, provided the housing is appropriately designed.

German Patent Reference 10 2004 054311.9-34, the priority document corresponding to this invention, and its teachings are incorporated, by reference, into this specification.

What is claimed is:

1. A cooling arrangement with a housing for receiving electronic printed circuit boards or plug-in modules, and with an air-conditioning device which is connected via a coolant-conducting feed line and a return-flow line with at least one electronic component, to be cooled, on the respective printed circuit board or plug-in module, wherein the feed line is coupled with at least one component feed line assigned to the electronic component, and the return-flow line with at least one component return-flow line assigned to the electronic component, the cooling arrangement comprising:

the component feed line (20) and the component return-flow line (22) having coupling elements (24, 26) attached at ends of the respective printed circuit board (10) or the plug-in module, the coupling element forming a releasable coupling connection together with counter coupling elements (28, 30) of the feed line (16) and the return-flow line (18);

a rear wall plate (44) with plug connectors (46) for data lines or plug connectors (48) for the voltage supply, which are engaged by corresponding counter plug connectors (50, 52) at the respective one of the printed circuit board (10) and the plug-in module; and a strut (54) extending across an upper edge of the rear wall plate (44), wherein the counter coupling elements (28, 30) of the feed and the return-flow lines (16, 18) are arranged on the strut (54), and the feed line (16) and the return-flow line (18) extend at least in part along the strut (54).

2. The cooling arrangement in accordance with claim 1, wherein the electronic component to be cooled is connectible with a liquid cooling body (32a, 32b, 32c) through which liquid flows and which has a first connector for the component feed line (20) and a second connector for the component return-flow line (22).

3. The cooling arrangement in accordance with claim 2, wherein the coupling element (24) of the component feed line (20) and the coupling element (26) of the return-flow line (22) are arranged side-by-side in a plug housing and form a coupling block (34).

4. The cooling arrangement in accordance with claim 3, wherein the counter coupling element (28) of the feed line (16) and the counter coupling (30) element of the return-flow line (18) are arranged side-by-side in a plug housing and form a counter coupling block (36).

5. The cooling arrangement in accordance with claim 4, wherein a plurality of components to be cooled and having liquid cooling bodies (32a, 32b, 32c) are arranged on one of a printed circuit board (10) and a plug-in module, and the liquid bodies (32a, 32b, 32c) are connected in series on the one of the printed circuit board (10) and the plug-in module by the component feed line (20) and the component return-flow line (22).

6. The cooling arrangement in accordance with claim 5, wherein the coupling connection is a no-drip releasable and pluggable coupling.

7. The cooling arrangement in accordance with claim 6, wherein the one of the electronic printed circuit boards (10) and the plug-in modules are housed vertically and extending parallel with respect to each other in the housing (12), and the feed line (16) and the return-flow line (18) extend horizontally at least in part in the housing (12).

8. The cooling arrangement in accordance with claim 7, wherein a plurality of housings are arranged on top of each other in a switchgear cabinet, and the feed line (16) and the return-flow line (18) extend vertically at least in part in the switchgear cabinet.

9. The cooling arrangement in accordance with claim 8, wherein the air-conditioning device (14) is arranged in the switchgear cabinet, and the feed line (16) and the return-flow line (18) supply each housing.

10. The cooling arrangement in accordance with claim 9, wherein the housing (12) has a receiving device for inserting the respective one of the electronic printed circuit board (10) and the plug-in module in a direction toward the rear wall of the device.

11. The cooling arrangement in accordance with claim 10, wherein in a state where inserted the respective one of the electronic printed circuit board (10) and the plug-in module is fixable in place in the housing (12) by a screw connection.

12. The cooling arrangement in accordance with claim 11, wherein a rear transition module (38) at the rear of the housing is assigned to the respective one of the printed circuit board (10) and the plug-in module, which has plug connectors (40) for electrical input and output signals, which are engaged by corresponding electric counter plug connectors (42) at the one of the printed circuit board (10) and the plug-in module.

13. The cooling arrangement in accordance with claim 12, wherein the feed line (16) and the return-flow line (18) are integrated into the strut (54).

14. The cooling arrangement in accordance with claim 13, wherein guide pins plug the one of the printed circuit board (10) and the plug-in module with the electrical plug connectors (40, 50, 52) and the liquid-conducting coupling connections (24, 26).

15. The cooling arrangement in accordance with claim 14, wherein at least one fan is arranged at one of the housing (12) and the respective one of the printed circuit board (10) and the plug-in module for creating a cooling air flow.

16. The cooling arrangement in accordance with claim 1, wherein the coupling element (24) of the component feed line (20) and the coupling element (26) of the return-flow line (22) are arranged side-by-side in a plug housing and form a coupling block (34).

17. The cooling arrangement in accordance with claim 1, wherein the counter coupling element (28) of the feed line (16) and the counter coupling (30) element of the return-flow line (18) are arranged side-by-side in a plug housing and form a counter coupling block (36).

18. The cooling arrangement in accordance with claim 1, wherein a plurality of components to be cooled and having liquid cooling bodies (32a, 32b, 32c) are arranged on one of a printed circuit board (10) and a plug-in module, and the liquid bodies (32a, 32b, 32c) are connected in series on the one of the printed circuit board (10) and the plug-in module by the component feed line (20) and the component return-flow line (22).

19. The cooling arrangement in accordance with claim 1, wherein the coupling connection is a no-drip releasable and pluggable coupling.

20. The cooling arrangement in accordance with claim 1, wherein the one of the electronic printed circuit boards (10) and the plug-in modules are housed vertically and extending parallel with respect to each other in the housing (12), and the feed line (16) and the return-flow line (18) extend horizontally at least in part in the housing (12).

21. The cooling arrangement in accordance with claim 1, wherein a plurality of housings are arranged on top of each other in a switchgear cabinet, and the feed line (16) and the return-flow line (18) extend vertically at least in part in the switchgear cabinet.

22. The cooling arrangement in accordance with claim 1, wherein in a state where inserted the respective one of the electronic printed circuit board (10) and the plug-in module is fixable in place in the housing (12) by a screw connection.

23. The cooling arrangement in accordance with claim 1, wherein the rear wall has a plurality of electric plug connectors engaged by counter plug connectors attached to the one of the printed circuit board (10) and the plug-in module.

24. The cooling arrangement in accordance with claim 1, further comprising a rear transition module (38) at the rear of the housing and assigned to the respective one of the printed circuit board (10) and the plug-in module, which has plug connectors (40) for electrical input and output signals, which are engaged by corresponding electric counter plug connectors (42) at the one of the printed circuit board (10) and the plug-in module.

25. The cooling arrangement in accordance with claim 1, wherein guide pins plug the one of the printed circuit board (10) and the plug-in module with electrical plug connectors (40,50,52) and the liquid-conducting coupling connections (24, 26).

26. The cooling arrangement in accordance with claim 1, wherein at least one fan is arranged at one of the housing (12) and the respective one of the printed circuit board (10) and the plug-in module for creating a cooling air flow.

27. A cooling arrangement with a housing for receiving electronic printed circuit boards or plug-in modules with at least one electronic component to be cooled on the respective printed circuit board or plug-in module, the cooling arrangement comprising:

an air-conditioning device (14) having a coolant-conducting feed line (16) and a return-flow line (18);

a component support (12) formed of a support frame (60);

each of the printed circuit boards or plug-in modules being releasably connected to a front of the support frame (60), and having an area for fitting electronic components and a coupling area including a component feed line (20) with a first coupling element (24) and a component return-flow line (22) with a second coupling element (26);

rear transition modules (38) forming a portion of a rear wall of the housing (12), each of the rear transition modules (38) releasably connected to the housing by screw connections, each of the rear transition modules (38) assigned a corresponding printed circuit board or plug-in module, each of the rear transition modules (38) including a plug connector (40) for electrical input and output signals, which are engaged by a corresponding electric counter plug connector (42) of the printed circuit board or the plug-in module;

a rear wall plate (44) connected to the support frame (60) and including plug connectors (46) for data lines or plug connectors (48) for the voltage supply, which are engaged by corresponding counter plug connectors (50, 52) at the respective one of the printed circuit board (10) and the plug-in module; and a strut (54) extending across an upper edge of the rear wall plate (44), the strut (54) including a plurality of counter coupling elements, the plurality of counter coupling elements including first counter coupling elements (28) connected to the feed line (16) and second counter coupling elements (30) connected to the return-flow line (18), wherein each of the first counter coupling elements (28) forms a releasable coupled connection with a corresponding one of the first coupling element (24) and each of the second counter coupling elements (30) forms a releasable coupled connection with a corresponding one of the second coupling element (26).

28. The cooling arrangement in accordance with claim 27, wherein each front side edge of the support frame (60) includes a laterally protruding frame element (66, 68) having a plurality of through-bores (70, 72), for mounting the component support (12) to the housing.

29. The cooling arrangement in accordance with claim 27, wherein the rear wall plate (44) is disposed between a portion of the rear transition modules (38) and the electronic printed circuit boards or plug-in modules.

* * * * *